(12) United States Patent
Lee et al.

(10) Patent No.: US 10,068,854 B2
(45) Date of Patent: Sep. 4, 2018

(54) SEMICONDUCTOR PACKAGE DEVICE AND METHOD OF MANUFACTURING THE SAME

(71) Applicant: Advanced Semiconductor Engineering, Inc., Kaohsiung (TW)

(72) Inventors: Wei-Hsuan Lee, Kaohsiung (TW); Jaw-Ming Ding, Kaohsiung (TW); Wei-Yu Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/333,008

(22) Filed: Oct. 24, 2016

(65) Prior Publication Data

US 2018/0114757 A1 Apr. 26, 2018

(51) Int. Cl.
| | |
|---|---|
| *H01L 23/31* | (2006.01) |
| *H01L 23/522* | (2006.01) |
| *H01L 23/60* | (2006.01) |
| *H01L 27/32* | (2006.01) |
| *H01L 23/552* | (2006.01) |
| *H01L 23/498* | (2006.01) |
| *H01L 23/00* | (2006.01) |
| *H01L 21/48* | (2006.01) |
| *H01L 21/56* | (2006.01) |

(52) U.S. Cl.
CPC .......... *H01L 23/552* (2013.01); *H01L 21/485* (2013.01); *H01L 21/4853* (2013.01); *H01L 21/565* (2013.01); *H01L 23/3114* (2013.01); *H01L 23/49838* (2013.01); *H01L 24/16* (2013.01); *H01L 24/48* (2013.01); *H01L 2224/16155* (2013.01); *H01L 2224/48225* (2013.01); *H01L 2924/1205* (2013.01); *H01L 2924/1206* (2013.01); *H01L 2924/1207* (2013.01); *H01L 2924/3025* (2013.01)

(58) Field of Classification Search
CPC ....... H01L 23/552; H01L 23/60; H01L 23/31; H01L 2924/3025; H01L 2924/146; H01L 2924/18; H01L 2924/1815; H01L 2924/1904–2924/19043; H01L 2924/1902; H01L 2225/06537; H01L 27/3272; H01L 2027/02; H01L 27/10
See application file for complete search history.

(56) References Cited

U.S. PATENT DOCUMENTS

| | | | |
|---|---|---|---|
| 7,701,728 B2* | 4/2010 | Hatanaka | H01L 23/3121 174/257 |
| 8,008,753 B1 | 8/2011 | Bolognia | |
| 9,001,528 B2* | 4/2015 | Yorita | H01L 21/565 361/816 |

(Continued)

*Primary Examiner* — David Zarneke
(74) *Attorney, Agent, or Firm* — Foley & Lardner LLP; Cliff Z. Liu (57) ABSTRACT

A semiconductor package device includes a substrate, a passive component, an active component and a package body. The passive component is disposed on the substrate. The active component is disposed on the substrate. The package body is disposed on the substrate. The package body includes a first portion covering the active component and the passive component, and a second portion covering the passive component. A top surface of the second portion of the package body is higher than a top surface of the first portion of the package body.

21 Claims, 6 Drawing Sheets

(56) References Cited

U.S. PATENT DOCUMENTS

| | | | | |
|---|---|---|---|---|
| 9,276,180 B2* | 3/2016 | Ishida | ................ | H01L 25/0753 |
| 9,349,664 B2* | 5/2016 | Ishida | ................ | H01L 25/0753 |
| 2009/0256244 A1* | 10/2009 | Liao | ..................... | H01L 21/568 |
| | | | | 257/660 |
| 2010/0013064 A1* | 1/2010 | Hsu | ..................... | H01L 23/055 |
| | | | | 257/660 |
| 2010/0032815 A1* | 2/2010 | An | ..................... | H01L 23/3121 |
| | | | | 257/660 |
| 2011/0115060 A1* | 5/2011 | Chiu | ..................... | H01L 21/568 |
| | | | | 257/660 |
| 2013/0093067 A1* | 4/2013 | Clark | ................... | H01L 23/552 |
| | | | | 257/659 |
| 2014/0001471 A1* | 1/2014 | Li | ........................ | H01L 23/552 |
| | | | | 257/48 |
| 2014/0239464 A1 | 8/2014 | Chung et al. | | |
| 2015/0016066 A1* | 1/2015 | Shimamura | ......... | H01L 23/3121 |
| | | | | 361/728 |
| 2015/0366085 A1* | 12/2015 | Shih | ..................... | H05K 1/111 |
| | | | | 361/752 |
| 2017/0294387 A1* | 10/2017 | Kawabata | ............. | H01L 23/552 |

* cited by examiner

SEMICONDUCTOR PACKAGE DEVICE AND METHOD OF MANUFACTURING THE SAME

BACKGROUND

1. Technical Field

The present disclosure relates to a semiconductor package device and a method of manufacturing the same, and more particularly, to a semiconductor package device including a shielding layer and a method of manufacturing the same.

2. Description of the Related Art

Semiconductor devices have become progressively more complex, driven at least in part by the demand for enhanced processing speeds and smaller sizes. Enhanced processing speeds tend to involve higher clock speeds, which can involve more frequent transitions between signal levels, which, in turn, can lead to a higher level of electromagnetic emissions at higher frequencies or shorter wavelengths. Electromagnetic emissions can radiate from a source semiconductor device, and can be incident upon neighboring semiconductor devices. If the level of electromagnetic emissions at a neighboring semiconductor device is sufficiently high, these emissions can adversely affect the operation of the neighboring semiconductor device. This phenomenon is sometimes referred to as electromagnetic interference (EMI). Smaller sized semiconductor devices can exacerbate EMI by providing a higher density of semiconductor devices within an overall electronic system, and, thus, a higher level of undesired electromagnetic emissions at neighboring semiconductor devices.

One way to reduce EMI is to shield a set of semiconductor devices within a semiconductor package device. In particular, shielding can be accomplished by including an electrically conductive casing or housing that is electrically grounded and is secured to an exterior of the package. When electromagnetic emissions from an interior of the package strike an inner surface of the casing, at least a portion of these emissions can be electrically shorted, thereby reducing the level of emissions that can pass through the casing and adversely affect neighboring semiconductor devices. Similarly, when electromagnetic emissions from a neighboring semiconductor device strike an outer surface of the casing, a similar electrical shorting can occur to reduce EMI of semiconductor devices within the package.

SUMMARY

In accordance with some embodiments of the present disclosure, a semiconductor package device includes a substrate, a passive component, an active component and a package body. The passive component is disposed on the substrate. The active component is disposed on the substrate. The package body is disposed on the substrate. The package body includes a first portion covering the active component and the passive component, and a second portion covering the passive component. A top surface of the second portion of the package body is higher than a top surface of the first portion of the package body.

In accordance with some embodiments of the present disclosure, a semiconductor package device includes a substrate, a first electronic component, a second electronic component, a first package body and a second package body. The first electronic component is disposed on the substrate. The second electronic component is disposed on the substrate. The first package body is disposed on the substrate to cover the second electronic component and to expose the first electronic component. The second package body is disposed on the first package body and covers the second electronic component.

In accordance with some embodiments of the present disclosure, a method of manufacturing a semiconductor package device includes: providing a substrate; disposing a first electronic component on the substrate; disposing a second electronic component on the substrate; forming a first package body on the substrate to cover the second electronic component and at least a portion of the first electronic component; forming a second package body on the first package body and above the second electronic component; and forming a conductive layer to cover the first package body and the second package body. A top surface of the second package body is higher than a top surface of the first package body.

Common reference numerals are used throughout the drawings and the detailed description to indicate the same or similar components. The present disclosure will be more apparent from the following detailed description taken in conjunction with the accompanying drawings.

DETAILED DESCRIPTION

Figure 1:
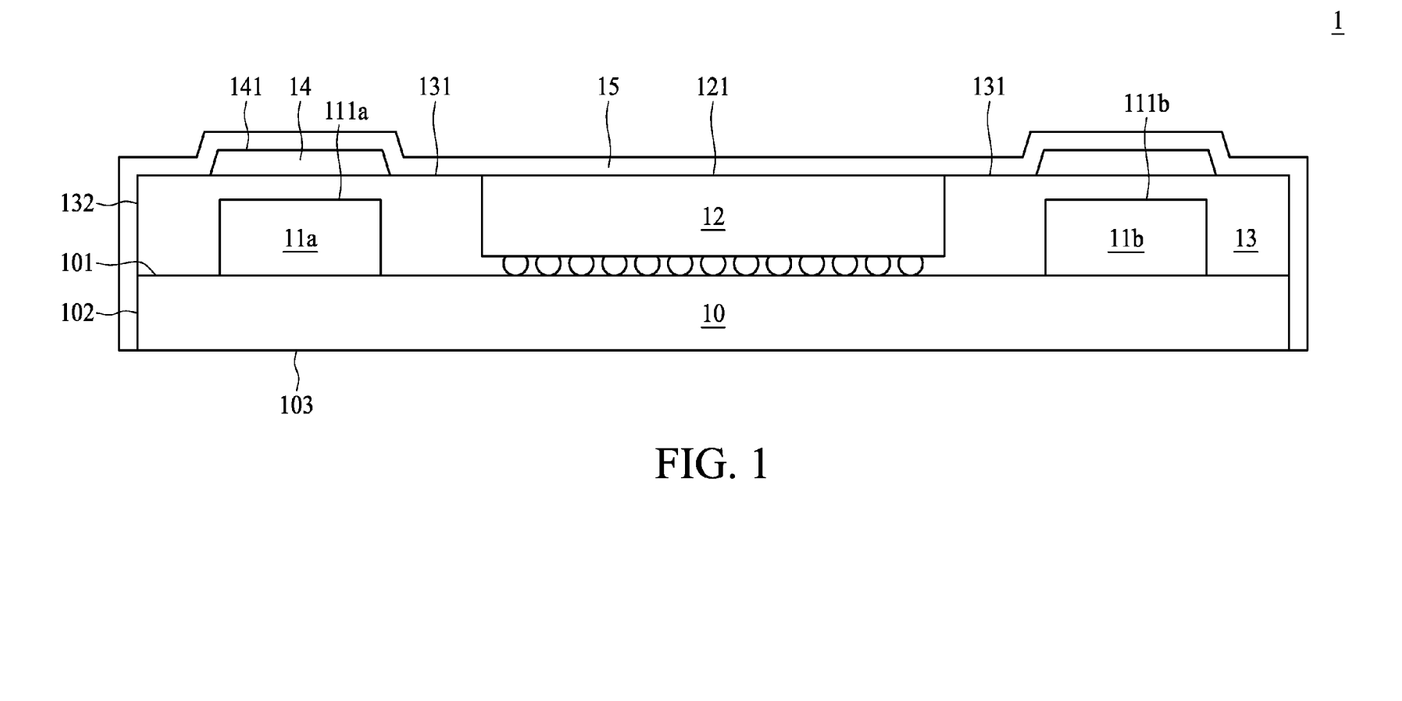
FIG. 1 illustrates a cross-sectional view of a semiconductor package device in accordance with some embodiments of the present disclosure.

FIG. 1 illustrates a cross-sectional view of a semiconductor package device 1 in accordance with some embodiments of the present disclosure. The semiconductor package device 1 includes a substrate 10, passive components 11a, 11b, an active component 12, package bodies 13, 14 and a shielding layer 15. In some embodiments, the package body 13 is referred to as a first package body 13 and the package body 14 is referred to as a second package body 14. In some embodiments, a package body includes a first portion 13 of the package body and a second portion 14 of the package body.

The substrate 10 may be, for example, a printed circuit board, such as a paper-based copper foil laminate, a composite copper foil laminate, or a polymer-impregnated glass-fiber-based copper foil laminate. The substrate 10 may include an interconnection structure, such as a redistribution layer (RDL) or a grounding element. In some embodiments, the grounding element is a via exposed from a lateral surface 102 of the substrate 10. In some embodiments, the grounding element is a metal layer exposed from the lateral surface 102 of the substrate 10. In some embodiments, the grounding element is a metal trace exposed from the lateral surface 102 of the substrate 10.

The passive components 11a, 11b are disposed on a top surface 101 of the substrate 10. The passive component 11a, 11b may be an electronic component, such as a capacitor, a resistor or an inductor. Each passive component 11a, 11b may be electrically connected to one or more of another passive component 11a, 11b and to the substrate 10 (e.g., to the RDL), and electrical connection may be attained by way of Surface Mount Technology (SMT).

The active component 12 is disposed on the top surface 101 of the substrate 10. The active component 12 may be an electronic component, such as an integrated circuit (IC) chip or a die. The active component 12 may be electrically connected to one or more of the passive components 11a, 11b and to the substrate 10 (e.g., to the RDL), and electrical connection may be attained by way of flip-chip or wire-bond techniques. In some embodiments, a height of the active component 12 measured from the top surface 101 of the substrate is greater than that of the passive components 11a, 11b. In some embodiments, the active component 12 is referred to as a first electronic component and the passive component 11a and/or 11b is referred to as a second electronic component.

The package body 13 is disposed on the top surface 101 of the substrate 10 and encapsulates a part of the top surface 101 of the substrate 10, the passive components 11a, 11b and a part of the active component 12. A backside surface 121 (e.g., a top surface) of the active component 12 is exposed from the package body 13. In other words, the backside surface 121 of the active component 12 is aligned with a top surface 131 of the package body 13; for example, the backside surface 121 of the active component 12 is substantially coplanar with the top surface 131 of the package body 13. In some embodiments, the package body 13 covers the respective backside surfaces 111a, 111b (e.g., top surfaces) of the passive components 11a, 11b. A lateral surface 132 of the package body 13 is aligned with the lateral surface 102 of the substrate 10; for example, the lateral surface 132 of the package body 13 is substantially coplanar with the lateral surface 102 of the substrate 10. In some embodiments, the package body 13 includes an epoxy resin having fillers dispersed therein.

The package body 14 is disposed on a portion of the top surface 131 of the package body 13 and over the passive components 11a, 11b. The package body 14 is not disposed over the active component 12. In some embodiments, a distance from a top surface 141 of the package body 14 to the respective backside surfaces 111a, 111b (e.g., top surfaces) of the passive components 11a, 11b is in a range from about 50 micrometers (μm) to about 100 μm. A thickness of the package body 14 (e.g., a distance from the top surface 141 of the package body 14 to the top surface 131 of the package body 13) is determined according to a thickness difference between the active component 12 and the passive components 11a, 11b. In some embodiments, an area of the package body 14 is greater than an area of each of the passive components 11a, 11b. In some embodiments, the package body 14 comprises, or is formed from, a photosensitive material, such as a photopolymer resin. In some embodiments, the package body 14 and the package body 13 comprise a same material. Alternatively, the package body 14 and the package body 13 may comprise different materials. In some embodiments, the top surface 141 of the package body 14 is higher than the top surface 131 of the package body 13. For example, a first distance may be between the top surface 141 of the package body 14 and the top surface 101 of the substrate 10, and a second distance may be between the top surface 131 of the package body 13 and the top surface 101 of the substrate 10, and the first distance may be greater than the second distance.

The shielding layer 15 is disposed on the backside surface 121 of the active component 12 and on external surfaces of the package body 13 and the package body 14 to cover the package body 13, the package body 14, the active component 12 and the lateral surfaces 102 of the substrate 10. The shielding layer 15 is electrically connected to the grounding element of the substrate 10. In some embodiments, the shielding layer 15 is a conformal shield. In some embodiments, a thickness of the shielding layer 15 is substantially uniform. A bottom of the shielding layer 15 is aligned with a bottom surface 103 of the substrate 10; for example, the bottom of the shielding layer 15 is substantially coplanar with the bottom surface 103 of the substrate 10. In some embodiments, the shielding layer 15 is a conductive thin film, and may include, for example, aluminum (Al), copper (Cu), chromium (Cr), tin (Sn), gold (Au), silver (Ag), nickel (Ni) or stainless steel, or a mixture, an alloy, or other combination thereof. The shielding layer 15 may include a single conductive layer or multiple conductive layers. In some embodiments, the shielding layer 15 includes multiple conductive layers, and the multiple conductive layers may include a same material, or ones of the multiple conductive layers may include different materials, or each of the multiple conductive layers may include different materials from others of the multiple conductive layers. In some embodiments, each conductive layer of the shielding layer 15 has a thickness of up to about 200 μm, such as up to about 150 μm, up to about 100 μm, up to about 50 μm, up to about 10 μm, up to about 5 μm, up to about 1 μm, or up to about 500 nanometers (nm). In some embodiments, each conductive layer of the shielding layer 15 has a thickness of down to about 100 nm or less, down to about 50 nm or less, or down to about 10 nm or less. In some embodiments, the shielding layer 15 includes multiple conductive layers, and the different conductive layers may have different thicknesses. Since the shielding layer 15 is conformal to the package body 14 and the package body 13, the shielding layer 15 includes a portion disposed on the package body 14 and another portion disposed on the package body 13, and a top surface of the former portion of the shielding layer 15 is higher than a top surface of the latter portion of the shielding layer 15.

In some other semiconductor package devices, a distance from a top surface of a package body to electronic components (e.g., mold clearance) may be insufficient, and thus a shielding layer in the semiconductor package device may increase unwanted parasitic capacitance, which may in turn deteriorate the reliability and function of the semiconductor package device. In accordance with some embodiments of the present disclosure, for example as shown in FIG. 1, the package body 14 is disposed over the passive components 11a, 11b to increase the mold clearance, so as to reduce the parasitic capacitance effect. By reducing the parasitic capacitance effect, the accuracy of the passive components 11a, 11b may increase and then insertion loss and return loss of a filter formed by the passive components 11a, 11b may be well controlled.

Figure 2:
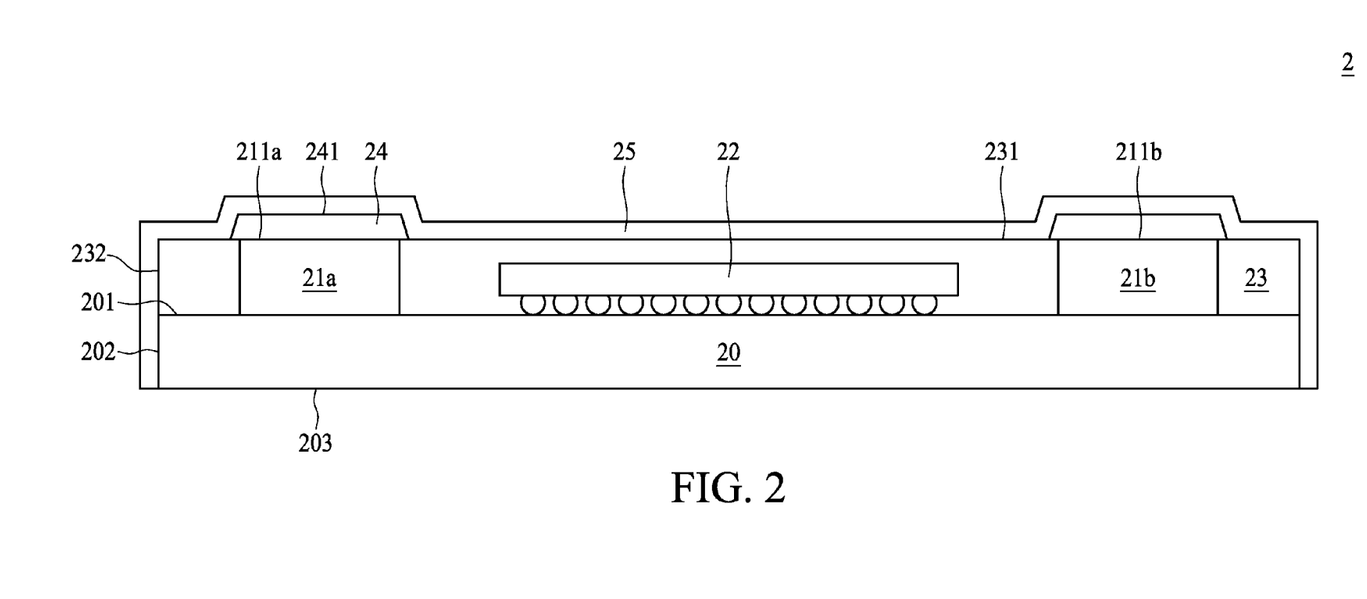
FIG. 2 illustrates a cross-sectional view of a semiconductor package device in accordance with some embodiments of the present disclosure.

FIG. 2 illustrates a cross-sectional view of a semiconductor package device 2 in accordance with some embodiments of the present disclosure. The semiconductor package device 2 includes a substrate 20, passive components 21a, 21b, an active component 22, a package body 23, a package body 24 and a shielding layer 25. In some embodiments, the package body 23 is referred to as a first package body 23 and the package body 24 is referred to as a second package body 24. In some embodiments, a package body includes a first portion 23 of the package body and a second portion 24 of the package body.

The substrate 20 may be, for example, a printed circuit board, such as a paper-based copper foil laminate, a composite copper foil laminate, or a polymer-impregnated glass-fiber-based copper foil laminate. The substrate 20 may include an interconnection structure, such as an RDL or a grounding element. In some embodiments, the grounding element is a via exposed from a lateral surface 202 of the substrate 20. In some embodiments, the grounding element is a metal layer exposed from the lateral surface 202 of the substrate 20. In some embodiments, the grounding element is a metal trace exposed from the lateral surface 202 of the substrate 20.

The passive components 21a, 21b are disposed on a top surface 201 of the substrate 20. The passive component 21a, 21b may be an electronic component, such as a capacitor, a resistor or an inductor. Each passive component 21a, 21b may be electrically connected to one or more of another passive component 21a, 21b and to the substrate 20 (e.g., to the RDL), and electrical connection may be attained by way of SMT.

The active component 22 is disposed on the top surface 201 of the substrate 20. The active component 22 may be an electronic component, such as an IC chip or a die. The active component 22 may be electrically connected to one or more of the passive components 21a, 21b and to the substrate 20 (e.g., to the RDL), and electrical connection may be attained by way of flip-chip or wire-bond techniques. In some embodiments, a height of the active component 22 measured from the top surface 201 of the substrate 20 is less than that of at least one of the passive components 21a, 21b. In some embodiments, the active component 22 is referred to as a first electronic component and the passive component 21a and/or 21b is referred to as a second electronic component.

The package body 23 is disposed on the top surface 201 of the substrate 20 and encapsulates a part of the top surface 201 of the substrate 20, a part of the passive components 21a, 21b and the active component 22. In some embodiments, both respective backside surfaces 211a, 211b (e.g., top surfaces) of the passive components 21a, 21b are exposed from the package body 23. In some embodiments, a single one of the respective backside surfaces 211a, 211b of the passive components 21a, 21b is exposed from the package body 23. In other words, in some embodiments, a top surface 231 of the package body 23 is aligned (e.g., substantially coplanar) with the backside surface 211a or 211b of one or more of the passive components 21a, 21b. A lateral surface 232 of the package body 23 is aligned with the lateral surface 202 of the substrate 20; for example, the lateral surface 232 of the package body 23 is substantially coplanar with the lateral surface 202 of the substrate 20. In some embodiments, the package body 23 includes an epoxy resin having fillers dispersed therein.

The package body 24 is disposed on a portion of the top surface 231 of the package body 23 and over the passive components 21a, 21b to cover the passive components 21a, 21b. The package body 24 is not disposed over the active component 22. In some embodiments, a distance from a top surface 241 of the package body 24 to the backside surface 211a or 211b (e.g., top surfaces) of one or more of the passive components 21a, 21b is in a range from about 50 μm to about 100 μm. A thickness of the package body 24 (e.g., a distance from the top surface 241 of the package body 24 to the top surface 231 of the package body 23) is determined according to a thickness difference between the active component 22 and the passive components 21a, 21b. In some embodiments, an area of the package body 24 is greater than an area of each of the passive components 21a, 21b. In some embodiments, the package body 24 comprises, or is formed from, a photosensitive material, such as a photopolymer resin. In some embodiments, the package body 24 and the package body 23 comprise a same material. Alternatively, the package body 24 and the package body 23 may comprise different materials. In some embodiments, the top surface 241 of the package body 24 is higher than the top surface 231 of the package body 24. For example, a first distance may be between the top surface 241 of the package body 24 and the top surface 201 of the substrate 20, and a second distance may be between the top surface 231 of the package body 23 and the top surface 201 of the substrate 20, and the first distance may be greater than the second distance.

The shielding layer 25 is disposed on external surfaces of the package body 23 and the package body 24 to cover the package body 23, the package body 24, the active component 22 and lateral surfaces 202 of the substrate 20. The shielding layer 25 is electrically connected to the grounding element of the substrate 20. In some embodiments, the shielding layer 25 is a conformal shield. In some embodiments, a thickness of the shielding layer 25 is substantially uniform. A bottom of the shielding layer 25 is aligned with a bottom surface 203 of the substrate 20; for example the bottom of the shielding layer 25 may be substantially coplanar with a bottom surface 203 of the substrate 20. In some embodiments, the shielding layer 25 is a conductive thin film, and may include, for example, Al, Cu, Cr, Sn, Au, Ag, Ni or stainless steel, or a mixture, an alloy, or other combination thereof. The shielding layer 25 may include a single conductive layer or multiple conductive layers. In some embodiments, the shielding layer 25 includes multiple conductive layers, and the multiple conductive layers may include a same material, or ones of the multiple conductive layers may include different materials, or each of the multiple conductive layers may include different materials from others of the multiple conductive layers. In some embodiments, each conductive layer of the shielding layer 25 has a thickness of up to about 200 μm, such as up to about 150 μm, up to about 100 μm, up to about 50 μm, up to about 10 μm, up to about 5 μm, up to about 1 μm, or up to about 500 nm. In some embodiments, each conductive layer of the shielding layer 25 has a thickness of down to about 100 nm or less, down to about 50 nm or less, or down to about 10 nm or less. In some embodiments, the shielding layer 25 includes multiple conductive layers, and the different conductive layers may have different thicknesses.

As stated above, since an additional package body (e.g., the package body 24) is disposed over the passive components 21a, 21b to increase the mold clearance, the parasitic capacitance effect due to insufficient mold clearance may be reduced. Therefore, the accuracy of the passive components 21a, 21b may increase and then insertion loss and return loss of a filter formed by the passive components 21a, 21b may be well controlled.

FIGS. 3A-3D illustrate a semiconductor manufacturing method in accordance with some embodiments of the present disclosure.

Figure 3A:
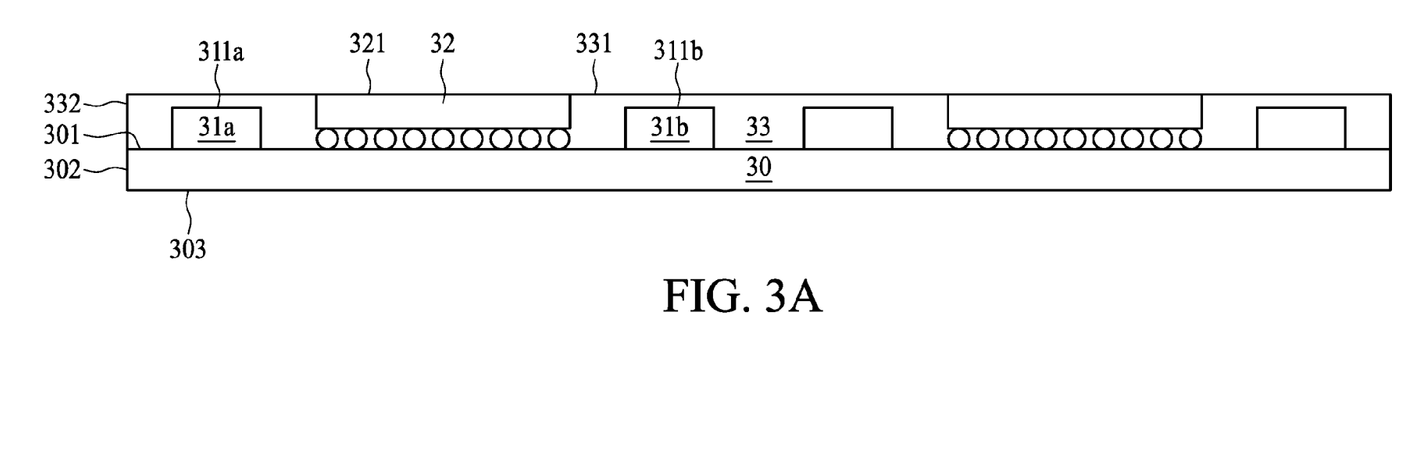
FIG. 3A, FIG. 3B, FIG. 3C and FIG. 3D illustrate a manufacturing method in accordance with some embodiments of the present disclosure.

Referring to FIG. 3A, a substrate strip including multiple substrates 30 is provided, and the provision of the multiple substrates 30 allows multiple semiconductor package devices to be manufactured concurrently. The substrate 30 may be, for example, a printed circuit board, such as a paper-based copper foil laminate, a composite copper foil laminate, or a polymer-impregnated glass-fiber-based copper foil laminate. The substrate 30 may include an interconnection structure, such as an RDL or a grounding element.

The passive components 31a, 31b are disposed on a top surface 301 of the substrate 30. The passive component 31a, 31b may be an electronic component, such as a capacitor, a resistor or an inductor. Each passive component 31a, 31b may be electrically connected to one or more of another passive component 31a, 31b and to the substrate 30 (e.g., to the RDL), and electrical connection may be attained by way of SMT.

The active component 32 is disposed on the top surface 301 of the substrate 30. The active component 32 may be an electronic component, such as an IC chip or a die. The active component 32 may be electrically connected to one or more of the passive electrical components 31a, 31b and to the substrate 30 (e.g., to the RDL), and electrical connection may be attained by way of flip-chip or wire-bond techniques. In some embodiments, a height of the active component 32 measured from the top surface 301 of the substrate 30 is greater than those of the passive components 31a, 31b. Alternatively, the height of the active component 32 may be less than that of at least one of the passive components 31a, 31b. In some embodiments, the active component 32 is referred to as a first electronic component and the passive component 31a and/or 31b is referred to as a second electronic component.

A package body 33 is formed on the top surface 301 of the substrate 30 and encapsulates a part of the top surface 301 of the substrate 30, the passive components 31a, 31b and a part of the active component 32. A backside surface 321 of the active component 32 is exposed from the package body 33. In other words, the backside surface 321 of the active component 32 is aligned with a top surface 331 of the package body 33; for example, the backside surface 321 of the active component 32 is substantially coplanar with the top surface 331 of the package body 33. A lateral surface 332 of the package body 33 is aligned with a lateral surface 302 of the substrate 30; for example, the lateral surface 332 of the package body 33 is substantially coplanar with the lateral surface 302 of the substrate 30. In some embodiments, the package body 33 includes an epoxy resin having fillers dispersed therein. The package body 33 may be formed by a molding technique, such as transfer molding or compression molding.

Figure 3B:
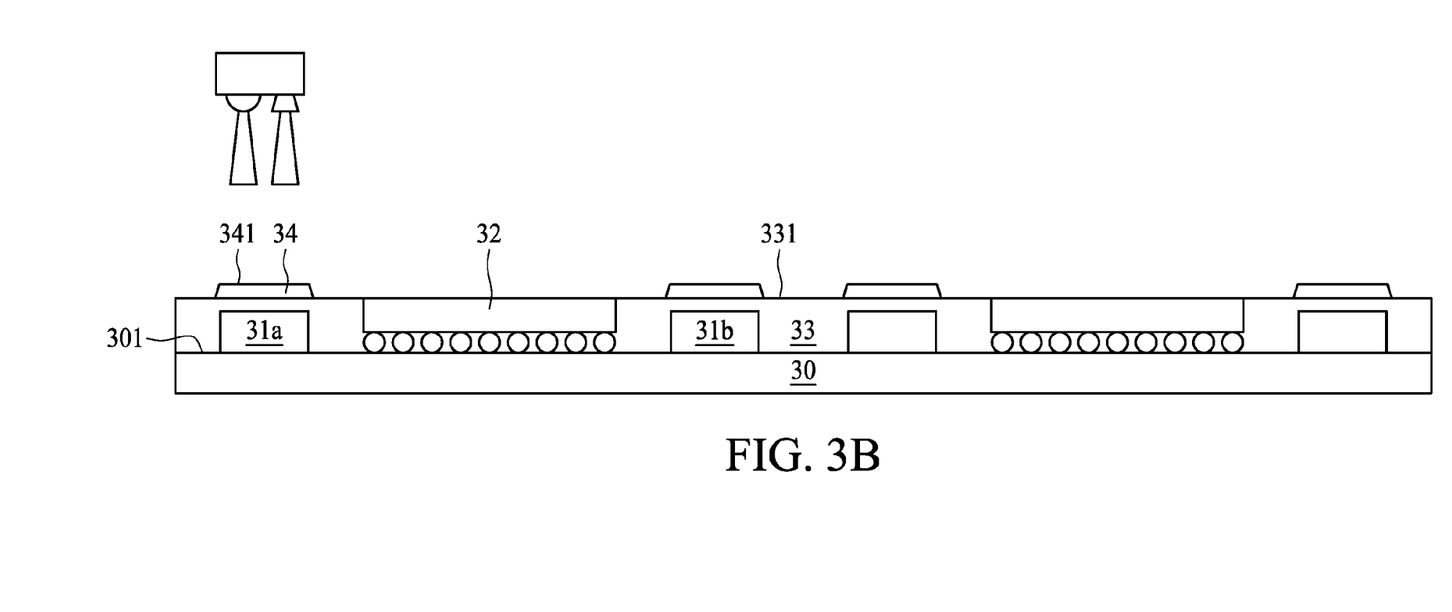

Referring to FIG. 3B, a package body 34 is formed on a portion of the top surface 331 of the package body 33 and over the passive components 31a, 31b. The package body 34 is not formed over the active component 32. In some embodiments, the package body 34 can be formed by the following operations: (i) coating a photosensitive material, such as a photopolymer resin on the top surface 331 of the package body 33 and over the passive components 31a, 31b; and (ii) curing the photosensitive material by ultra violet (UV) light. In operation (i), the coating can be accomplished by spraying. In some embodiments, a distance from a top surface 341 of the package body 34 to the backside surface 311a or 311b (e.g., top surfaces) of one or more of the passive components 31a, 31b is in a range from about 50 μm to about 100. A thickness of the package body 34 (e.g., a distance from the top surface 341 of the package body 34 to the top surface 331 of the package body 33) is determined according to a thickness difference between the active component 32 and the passive components 31a, 31b. In some embodiments, an area of the package body 34 is greater than an area of each of the passive components 31a, 31b. In some embodiments, the package body 34 and the package body 33 comprise a same material. Alternatively, the package body 34 and the package body 33 may comprise different materials. In some embodiments, the top surface 341 of the package body 34 is higher than the top surface 331 of the package body 33. For example, a first distance may be between the top surface 341 of the package body 34 and the top surface 301 of the substrate 30, and a second distance may be between the top surface 331 of the package body 33 and the top surface 301 of the substrate 30, and the first distance may be greater than the second distance. In some embodiments, the package body 33 is referred to as a first package body 33 and the package body 34 is referred to as a second package body 34. In some embodiments, a package body includes a first portion 33 of the package body and a second portion 34 of the package body.

Figure 3C:
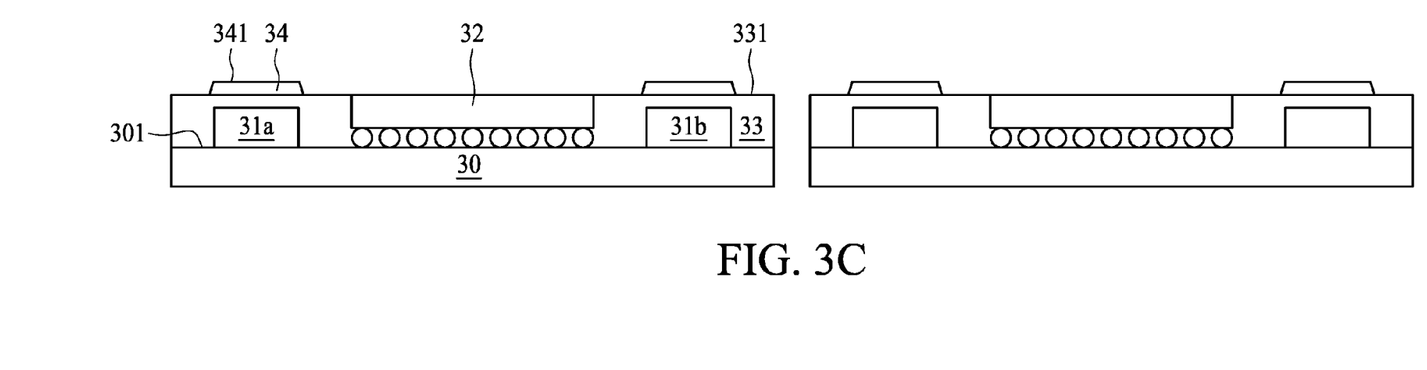

Referring to FIG. 3C, singulation may be performed to separate out individual semiconductor package devices. That is, the singulation is performed through the package body 33 and the substrate strip including the substrates 30. The singulation may be performed, for example, by using a dicing saw, laser or other appropriate cutting technique.

Figure 3D:
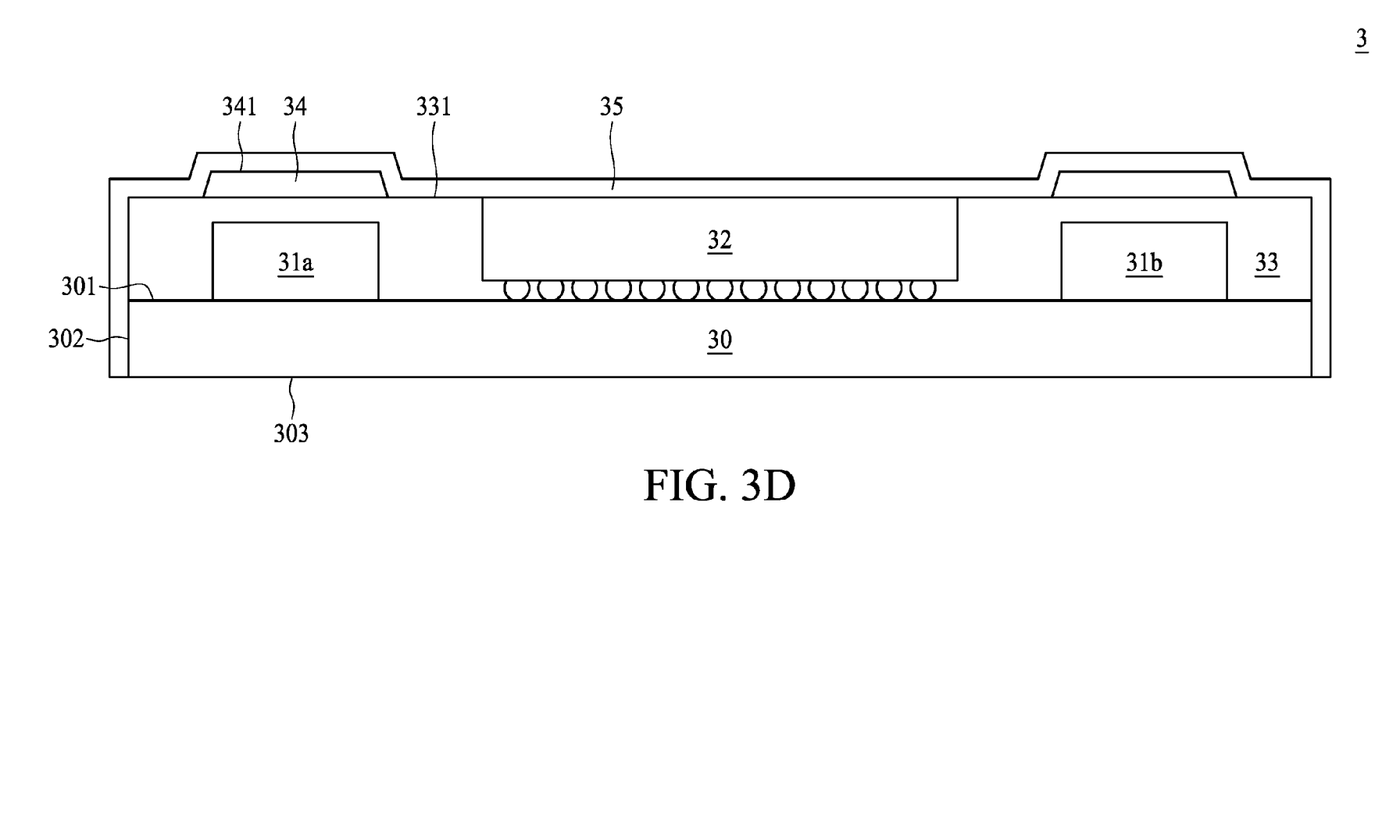

Referring to FIG. 3D, a shielding layer 35 is formed to cover the exterior surface of the package body 33, the package body 34 and a lateral surface 302 of the substrate 30. In some embodiments, the shielding layer 35 is a conformal shield. In some embodiments, a thickness of the shielding layer 35 is substantially uniform. A bottom of the shielding layer 35 is aligned with a bottom surface 303 of the substrate 30; for example, the bottom of the shielding layer 35 is substantially coplanar with the bottom surface 303 of the substrate 30. In some embodiments, the shielding layer 35 can be formed by sputtering or other appropriate technique. In some embodiments, the shielding layer 35 is a conductive thin film, and may include, for example, Al, Cu, Cr, Sn, Au, Ag, Ni or stainless steel, or a mixture, an alloy, or other combination thereof.

The shielding layer 35 may include a single conductive layer or multiple conductive layers. In some embodiments, the shielding layer 35 includes multiple conductive layers, and the multiple conductive layers may include a same material, or ones of the multiple conductive layers may include different materials, or each of the multiple conductive layers may include different materials from others of the multiple conductive layers. In some embodiments, each conductive layer of the shielding layer 35 has a thickness of up to about 200 μm, such as up to about 150 μm, up to about 100 μm, up to about 50 μm, up to about 10 μm, up to about 5 μm, up to about 1 μm, or up to about 500 nm. In some embodiments, each conductive layer of the shielding layer 35 has a thickness of down to about 100 nm or less, down to about 50 nm or less, or down to about 10 nm or less. In some embodiments, the shielding layer 35 includes multiple conductive layers, and the different conductive layers may have different thicknesses.

In the operation shown in FIG. 3B, the package body 34 is additionally formed over the passive components 31a, 31b to increase the mold clearance, so the parasitic capacitance effect due to insufficient mold clearance may be reduced. Therefore, the accuracy of the passive components 31a, 31b may increase and then insertion loss and return loss of a filter formed by the passive components 31a, 31b may be well controlled.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within μm of lying along a same plane, such as within 40 μm, within 30 μm, within 20 μm, within 10 μm, or within 1 μm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

In the description of some embodiments, a component provided "on" another component can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package device comprising:
   a substrate having a top surface;
   a passive component disposed on the substrate and having a top surface;
   an active component disposed on the substrate and having a top surface; and
   a package body disposed on the substrate, the package body comprising a first portion covering the active component and the passive component, and a second portion covering the passive component, wherein a top surface of the second portion of the package body is higher than a top surface of the first portion of the package body,
   wherein a distance between the top surface of the active component and the top surface of the substrate is greater than a distance between the top surface of the passive component and the top surface of the substrate.

2. The semiconductor package device according to claim 1, further comprising a conductive layer disposed on the package body.

3. The semiconductor package device according to claim 1, wherein the top surface of the first portion of the package body is aligned with a backside surface of the active component.

4. The semiconductor package device according to claim 1, wherein the top surface of the first portion of the package body is aligned with a backside surface of the passive component.

5. The semiconductor package device according to claim 1, wherein the second portion of the package body comprises a cured photosensitive material.

6. The semiconductor package device according to claim 1, wherein an area of the second portion of the package body is larger than an area of the passive component.

7. The semiconductor package device according to claim 1, wherein a distance from the top surface of the second portion of the package body to a backside surface of the passive component is in a range from about 50 micrometers (μm) to about 100 μm.

8. The semiconductor package device of claim 2, wherein the conductive layer is conformal with the package body.

9. The semiconductor package device of claim 2, wherein a backside surface of the active component contacts the conductive layer.

10. The semiconductor package device of claim 1, wherein a portion of the passive component is exposed from the first portion of the package body and is covered by the second portion of the package body.

11. The semiconductor package device according to claim 1, wherein the top surface of the first portion of the package body is substantially coplanar with the top surface of the active component.

12. A semiconductor package device, comprising:
    a substrate;
    a passive component disposed on the substrate;
    an active component disposed on the substrate;
    a first package body disposed on the substrate and covering at least a portion of the passive component and the active component; and
    a second package body disposed on a portion of the first package body and over the passive component,
    wherein a distance between a top surface of the second package body and a top surface of the substrate is greater than a distance between a top surface of the first package body and the top surface of the substrate.

13. The semiconductor package device according to claim 12, further comprising a conductive layer disposed on the first package body and the second package body.

14. The semiconductor package device according to claim 12, wherein the conductive layer contacts a backside surface of the active component.

15. The semiconductor package device according to claim 12, wherein the top surface of the first package body is aligned with a backside surface of the active component.

16. The semiconductor package device according to claim 12, wherein the top surface of the first package body is aligned with a backside surface of the passive component.

17. The semiconductor package device according to claim 12, wherein a backside surface of the passive component is exposed from the first package body and is covered by the second package body.

18. The semiconductor package device according to claim 12, wherein the first package body and the second package body comprise a same material.

19. The semiconductor package device according to claim 12, wherein the first package body and the second package body comprise different materials and the second package body comprises a photosensitive material.

20. The semiconductor package device according to claim 19, wherein the second package body comprises a cured photosensitive material.

21. The semiconductor package device according to claim 12, wherein a distance from the top surface of the second package body to a backside surface of the passive component is in a range from about 50 μm to about 100 μm.

* * * * *